United States Patent
Gandhi

(10) Patent No.: US 10,236,229 B2
(45) Date of Patent: Mar. 19, 2019

(54) STACKED SILICON PACKAGE ASSEMBLY HAVING CONFORMAL LID

(71) Applicant: Xilinx, Inc., San Jose, CA (US)

(72) Inventor: Jaspreet Singh Gandhi, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/192,235

(22) Filed: Jun. 24, 2016

(65) Prior Publication Data
US 2017/0372979 A1    Dec. 28, 2017

(51) Int. Cl.
| | |
|---|---|
| *H01L 23/04* | (2006.01) |
| *H01L 23/13* | (2006.01) |
| *H01L 23/367* | (2006.01) |
| *H01L 23/58* | (2006.01) |
| *H01L 25/065* | (2006.01) |
| *H01L 23/00* | (2006.01) |
| *H01L 23/538* | (2006.01) |
| *H01L 23/373* | (2006.01) |

(52) U.S. Cl.
CPC .............. *H01L 23/13* (2013.01); *H01L 23/04* (2013.01); *H01L 23/367* (2013.01); *H01L 23/3675* (2013.01); *H01L 23/5384* (2013.01); *H01L 23/5385* (2013.01); *H01L 23/562* (2013.01); *H01L 23/585* (2013.01); *H01L 25/0655* (2013.01); *H01L 23/3737* (2013.01); *H01L 2224/16225* (2013.01); *H01L 2224/73204* (2013.01); *H01L 2924/15311* (2013.01)

(58) Field of Classification Search
CPC ......... H01L 23/04; H01L 23/14; H01L 23/28; H01L 23/36; H01L 23/367; H01L 25/0655
See application file for complete search history.

(56) References Cited

U.S. PATENT DOCUMENTS

| | | | |
|---|---|---|---|
| 6,065,530 A | 5/2000 | Austin et al. | |
| 8,598,698 B1 | 12/2013 | Lim | |
| 2002/0050398 A1 | 5/2002 | Coico et al. | |
| 2013/0119527 A1 | 5/2013 | Luo et al. | |
| 2014/0009992 A1 | 1/2014 | Poulton | |
| 2014/0091461 A1 | 4/2014 | Shen | |
| 2015/0001701 A1* | 1/2015 | Li | H01L 23/3737 257/713 |
| 2015/0155218 A1* | 6/2015 | Hung | H01L 23/36 257/690 |

FOREIGN PATENT DOCUMENTS

JP      60020538      2/1985

* cited by examiner

*Primary Examiner* — Cuong Q Nguyen

(74) *Attorney, Agent, or Firm* — Keith Taboada

(57) ABSTRACT

A chip package assembly and method for fabricating the same are provided which utilize a conformal lid to improve the chip package assembly from deformation. In one example, a chip package assembly is provided that includes integrated circuit (IC) dies, a packaging substrate, and a lid. The packaging substrate has a die receiving area that is defined by the laterally outermost extents of the IC dies mounted to the packaging substrate. The lid a surface that includes a first region and a second region. The first region is disposed over the first IC die while the second region of the lid extends below the second surface the first IC die and is spaced above the packaging substrate. At least a portion of the second region of the lid is overlapped with the die receiving area.

11 Claims, 5 Drawing Sheets

STACKED SILICON PACKAGE ASSEMBLY HAVING CONFORMAL LID

TECHNICAL FIELD

Embodiments of the present invention generally relate to a chip package assembly, and in particular, to chip package assembly comprising at least integrated circuit (IC) die disposed on a package substrate or interposer, and a conformal lid.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

Out of plane deformation of the package substrate, i.e., warpage, can be problematic to conventional chip packaging schemes. Warpage is particularly problematic in conventional chip packaging schemes that have an asymmetrical die distribution about at least one of the horizontal axes. Such warpage or bending of the package substrate can lead to solder connection failure or other damage to the components and devices of the chip package assembly, which may detrimentally effect device performance and reliability.

In many instances, dummy dies are utilized to stiffen the package substrate against out of plane deformation. The use of dummy dies is particularly common on chip packages that integrate high band-width memory (HBM) with field programmable gate arrays (FPGA). However, dummy dies undesirably increase the cost of the chip package. Additionally, die attach films often utilized to attach the dummy dies to an underlying substrate typically have high coefficients of thermal expansion (CTE), which undesirably contributes to delamination and crack initiation.

Therefore, a need exists for an improved chip package assembly, and in particular, to a chip package assembly having a conformal lid.

SUMMARY

A chip package assembly and method for fabricating the same are provided which utilize a conformal lid to improve the chip package assembly from deformation. In one example, a chip package assembly is provided that includes a first and second integrated circuit (IC) dies, a packaging substrate, and a lid. Each IC die has a first surface and a second surface that faces way from the first surface. The packaging substrate has a first surface having a die receiving area surrounded by a ring shaped border. The die receiving area is defined by the laterally outermost extents of the IC dies mounted to the first surface of the packaging substrate. The lid has a first surface and a second surface that faces away from the first surface. The second surface of the lid has a first region and a second region. The first region is disposed over the first IC die, while the second region of the lid extends below the first surface the first IC die and is spaced above the first surface of the packaging substrate. At least a portion of the second region of the lid is overlapped with the die receiving area.

In another example, a chip package assembly is provided that includes a first integrated circuit (IC) die, a second IC die, a package substrate, an interposer and a lid. Each of the first and second IC dies has a first surface and a second surface that faces way from the first surface. The interposer has a first surface and a second surface. The second surface of the interposer is coupled to the package substrate. The first surface of the interposer has the first IC die and second IC die mounted thereto. The first surface of the interposer has a die receiving area surrounded by a ring shaped border, wherein the die receiving area is defined by the laterally outermost extents of the IC dies mounted to the first surface of the interposer. The lid has a first surface and a second surface that faces away from the first surface. The second surface of the lid has a first region, a second region and a mounting region. The first region is disposed over the first IC die. The second region of the lid extends below the first surface the first IC die and is spaced above the first surface of the packaging substrate. At least a portion of the second region of the lid is overlapped with the die receiving area. The mounting region circumscribes the first and second regions, and is structurally connected to the first surface of the package substrate.

In another example, a chip package assembly is provided that includes a plurality of integrated circuit (IC) dies, a package substrate, an interposer and a lid. Each of the IC dies has a first surface and a second surface that faces way from the first surface. The interposer has a first surface and a second surface. The second surface of the interposer is coupled to the package substrate. The first surface of the interposer has at least a first IC die and a second IC die of the plurality of IC dies mounted thereon. The lid includes first surface and a second surface that faces away from the first surface. The second surface of the lid has a first region, a second region, a third region and a mounting region. The first region is disposed vertically above at least the first IC die and separates the second region from the third region. The second and third regions of the lid extend below the first surface the first IC die and are spaced vertically above the first surface of the interposer. At least a portion of the second and third regions of the lid laterally overlap the interposer. The mounting region circumscribes the first, second and third regions laterally outward of the interposer. The mounting region is structurally connected to the package substrate.

In another example, a method for fabricating a chip package assembly is provided that includes attaching a lid to a packaging substrate, wherein at least a first region of the lid is thermally connected directly to one or more IC dies by thermal interface material and at least a second region of the lid is thermally connected directly to an interposer by thermal interface material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize a conformal lid. The chip package assembly described herein includes at least one integrated circuit (IC) die and conformal lid disposed on a packaging substrate. The surface of the lid facing the packaging substrate is "conformal" to the topography of the dies across a die receiving area of the packaging substrate, thereby substantially eliminating the need and associated cost for dummy dies within the die receiving area to reduce susceptibility of the chip package assembly to out of plane deformation during the fabrication and use of the chip package assembly. Advantageously, the enhanced stiffness of the chip package assembly improves reliability and performance. Furthermore, the conformal lid enhances heat transfer across the entire the die receiving area of the packaging substrate, thereby reducing hot spots directly over IC dies which could induce warpage or provide insufficient temperature control of the IC dies.

Figure 1:
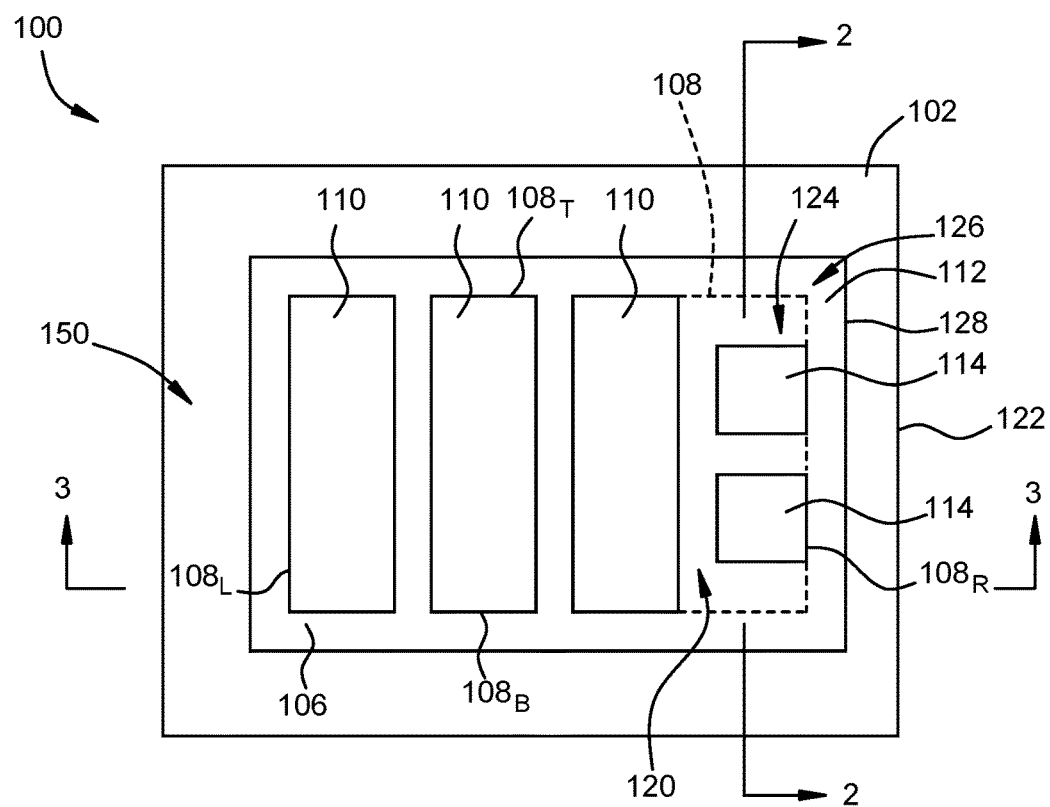
FIG. 1 is a schematic top view of a chip package assembly having a conformal lid removed to revile an exemplary geometric arrangement of integrated circuit (IC) dies.
Figure 2:
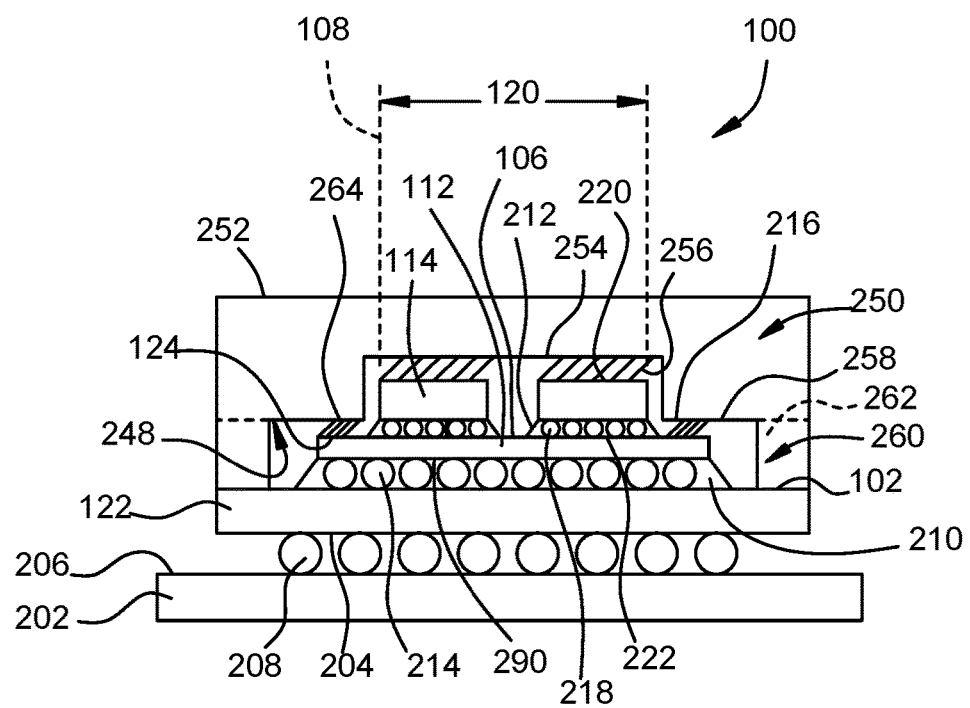
FIG. 2 is a schematic sectional view of the chip package assembly of FIG. 1 taken along section line 2-2 and passing through the conformal lid.
Figure 3:
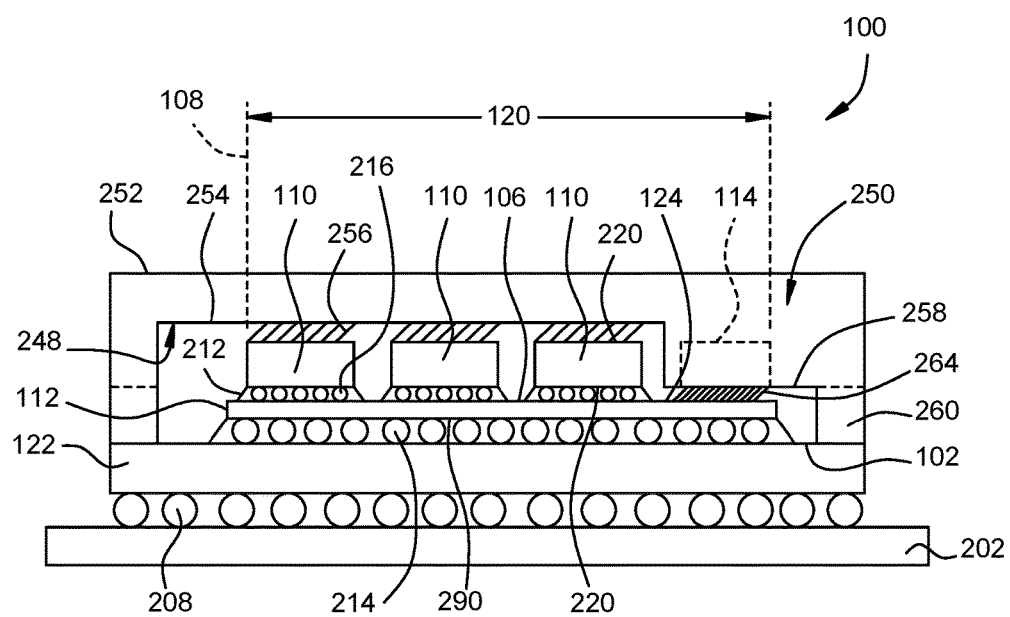
FIG. 3 is a schematic sectional view of the chip package assembly of FIG. 1 taken along section line 3-3 and passing through the conformal lid.

Turning now to FIG. 1, a schematic top view of an exemplary chip package assembly 100 having a conformal lid removed to revile an exemplary geometric arrangement of integrated circuit (IC) dies is schematically illustrated. The conformal lid (250) is illustrated in FIGS. 2-3, and is described in detail below. Although two IC dies 114 and three IC dies 110 are shown in FIG. 1, the total number of IC dies may range from two to as many as can be fit within the chip package assembly 100. Examples of IC dies 110, 114 that may be utilized in the chip package assembly 100 include, but are not limited to, programmable logic devices, such as field programmable gate arrays (FPGA), memory devices, such as high band-width memory (HBM), optical devices, processors or other IC logic structures. One or more of the IC dies 110, 114 may optionally include optical devices such as photo-detectors, lasers, optical sources, and the like. In the example depicted in FIG. 1, the IC dies 110 are field programmable gate arrays (FPGA) while the IC dies 114 are high band-width memory (HBM) dies. It is contemplated that the IC dies comprising the chip package assembly 100 may be the same or different types, including types other than HBM and FPGA dies.

In the top view of FIG. 1, the IC dies 110, 114 are oriented in an arrangement that is asymmetrical about at least one direction or axis in the horizontal plane. For example, as all the IC dies 110 are positioned to the right of the IC dies 114, the arrangement of dies is asymmetrical about a vertical axis while being symmetrical about a horizontal axis, the vertical extending between the top and bottom of the illustration of FIG. 1. In alternative embodiments, the arrangement of IC dies 110, 114 may be asymmetrical or symmetrical about both axes, or have another arrangement.

The chip package assembly 100 includes a packaging substrate 150 on which the IC dies 110, 114 are mounted. The packaging substrate 150 is generically utilized to mean either: (1) a package substrate 122 when the IC dies are directly coupled thereto without an intervening substrate (i.e., an interposer); or (2) an interposer 112 disposed on a first surface 102 of a package substrate 122 when the IC dies are directly coupled to the interposer 112. The interposer 112, when utilized, may include a substrate having through-substrate vias (TSV) supporting a metalization interconnect layer, or a substrate-less interposer having only a metalization interconnect layer without the use of TSVs. Although in the embodiment depicted in FIG. 1 the packaging substrate 150 is depicted as the interposer 112, the associated description of the dies and lid interfacing with the interposer 112 is substantially identical for the dies and lid interfacing with the package substrate 122 when the packaging substrate 150 is solely the package substrate 122 without use of an intervening interposer.

Referring additionally to sectional view of FIG. 2, the interposer 112 includes a first surface 106 and a second surface 290 connected by a sidewall such that the first and second surfaces 106, 290 face opposite directions. A first surface 220 of the IC dies 110, 114 faces away from the interposer 112, while a second surface 222 of the IC dies 110, 114 faces and is mounted to the first surface 106 of the interposer 112. The first surface 106 of the interposer 112 facing the second surface 222 of the IC dies 110, 114 has an IC die receiving area 120 that is optionally circumscribed by a boundary area 126. The boundary area 126 may be ring shaped, such as a rectangular or square ring. The die receiving area 120 is defined by outermost edges ($108_L$, $108_R$, $108_T$, $108_B$) the IC dies 110, 114 (when considered as a single group of dies) mounted to the first surface 106 of the packaging substrate 150 extended to intersect at right angles, as illustrated by a dashed imaginary line 108. A portion of the dashed imaginary line 108 is hidden by the die edges $108_L$, $108_R$, $108_T$, $108_B$ in the illustration of FIG. 1 as they are linearly aligned.

The die receiving area 120 generally has regions covered by the IC dies 110, 114 and regions that are not covered by the IC dies 110, 114. The regions that are not covered by the IC dies 110, 114 are referred to as free regions 124. The free regions 124 may be large enough to mount a die thereto. In conventional chip package assemblies, at least a portion of the free regions would be utilized to mount dummy dies. The number of free regions 124 may vary with specific packaging schemes, for example from 1 to many. In the example depicted in FIG. 1, the first surface 106 of the interposer 112 includes multiple free regions 124 that are separated by at least one IC die, such as both IC dies 110.

Referring now primarily to FIGS. 2 and 3, interposer 112 includes circuitry for electrically connecting the IC dies 110, 114 to circuitry of the package substrate 122. The circuitry of the interposer 112 may optionally include transistors and/or other circuit elements. Package bumps 214, also known as "C4 bumps," are utilized to provide an electrical connection between the circuitry of the interposer 112 and the circuitry of the package substrate 122. A second surface 204 of the package substrate 122 may be mounted and connected to a first surface 206 of a printed circuit board (PCB) 202, utilizing solder balls 208, wire bonding or other suitable technique.

As discussed above, the IC dies 110, 114 are mounted to the first surface 106 of the interposer 112, or alternatively in implementations wherein an interposer is not utilized, to the first surface 102 of the package substrate 122. In the example depicted in FIGS. 2-3, the IC dies 110, 114 are mounted to the first surface 106 of the interposer 112 by a plurality of micro-bumps 218. The micro-bumps 218 electrically connect the circuitry of each IC die 110, 114 to circuitry of the interposer 112. The circuitry of the interposer 112 connects the micro-bumps 218 to selective package bumps 214, and hence, connects selective circuitry of each IC die 110, 114 to the package substrate 122, to enable communication of the IC dies 110, 114 with the PCB 202 after the chip package assembly 100 is mounted within an electronic device (not shown). When the optional interposer 112 is not present, the micro-bumps 218 connects selective circuitry of each IC die 110, 114 to the package substrate 122 to enable communication of the IC dies 110, 114 with the PCB 202. An undermolding 212 may be utilized to fill the space not taken by the micro-bumps 218 between the IC dies 110, 114 and interposer 112. An undermolding 210 may be utilized to fill the space not taken by the package bumps 214 between the package substrate 122 and interposer 112.

The conformal lid 250 is disposed over the IC dies 110, 114. In some implementations, the lid 250 may be fabricated from a plastic material or other suitable material. In other implementations particularly where it is desirable to utilize the lid 250 to receive heat from the IC dies 110, 114, the lid 250 may be fabricated from a thermally conductive material, such as stainless steel, copper, nickel-plated copper or aluminum, among other suitable materials. In the region of the lid 250 directly over the IC dies 110, 114, the lid 250 may have a thickness of between about 0.5 mm and about 3.0 mm, although other thicknesses may be utilized. A heat sink, not shown, may optionally be mounted to a first surface 252 of the lid 250.

The lid 250 may be structurally coupled to the package substrate 122 to increase the rigidity of the chip package assembly 100. For example, a second surface 248 of the lid 250 that faces way from the first surface 252 may be coupled to the first surface 102 of the package substrate 122 by an adhesive (not shown), such as an epoxy. Optionally, a separate stiffener, shown in phantom by reference numeral 262, may be utilized to structurally couple the lid 250 to the package substrate 122. When used, the stiffener 262 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 262 can also be made of organic materials such as copper-clad laminate.

The second surface 248 of the lid 250 includes at least three discreet regions. A first region 254 is generally configured to align over the IC dies 110, 114 mounted in the die receiving area 120 of the first surface 106 of the interposer 112. The lid 250 is generally thinnest at the first region 254. A second region 258 is disposed immediately adjacent the first region 254. The second region 258 is generally configured to align over at least a portion of the free region 124 of the die receiving area 120. The surface of the second region 258 generally extends further away from the first surface 252 of the lid 250 than the first region 254. In one example, the second region 258 extends far enough from the first surface 252 of the lid 250 to overlap the IC dies 110, 114 when the lid 250 is mounted to the package substrate 122. Stated differently, the second region 258 of the lid 250 extends below the first surface 220 the IC dies 110, 114. As such, the lid 250 is thicker at the second region 258 relative a thickness of the lid 250 at the first region 254. A mounting region 260 of the lid 250 is disposed outward of, and circumscribes the first and second regions 254, 258. The mounting region 260 is also generally outward of the interposer 112. The mounting region 260 generally extends further away from the first surface 252 of the lid 250 than the second region 258 to enable the lid 250 to be mounted over the interposer 112 and structurally couple to the package substrate 122. As such, the lid 250 is thicker at the mounting region 260 relative a thickness of the lid 250 at the second region 258. In embodiments wherein a stiffener is utilized, the mounting region 260 may be simply configured to effectively couple to the stiffener in a position laterally outward of the interposer 112.

The stepped second surface 248 of the lid 250 created by the regions 254, 258, 260 significantly increases the resistance of the lid 250 to out of plane deformation. Consequently, the chip package assembly 100 is also significantly stiffer and resistant to warpage compared to conventional flat lids, making for more robust and dependable solder connections, along with enhancing performance and reliability of the IC dies 110, 114 comprising the chip package assembly 100.

A thermal interface material (TIM) 256 may be utilized to couple the first region 254 of the lid 250 to the IC dies 110, 114. The TIM 256 may be selected to provide a thermally conductive path between the lid 250 to the IC dies 110, 114 so that heat generated by the IC dies 110, 114 may be efficiently dissipated through the lid 250. The TIM 256 may be a soft or compliant adhesive to allow compensation between mismatched heights of neighboring IC dies 114 within the chip package assembly 100. In one example, the TIM 256 may be a thermal gel or thermal epoxy, such as for example, packaging component attach adhesives available from AI Technology, Inc., located in Princeton Junction, N.J.

Advantageously, the thicker second region 258 of the lid 250 also functions as a heat sink for the adjacent thinner first region 254 of the lid 250. Thus, heat transferring from the IC dies 110, 114 to the first region 254 of the lid 250 is effectively and rapidly spread outward into the thicker second region 258, thereby reducing the potential of unwanted hot spots on the lid 250, which further enhances the performance and reliability of function the IC dies 110, 114 comprising the chip package assembly 100.

Additionally, as the second region 258 of the lid 250 extends beyond the IC dies 110, 114 to a position closely spaced from the interposer 112, a thermal interface material (TIM) 264 may be utilized to couple the second region 258 of the lid 250 to the free region 124 of the die receiving area 120 defined on the first surface 106 of the interposer 112. The TIM 264 may be selected to provide a thermally conductive path between the lid 250 to the interposer 112, so that heat generated by the IC dies 110, 114 and transferred to the adjoining regions of the interposer 112 may be advantageously dissipated through the lid 250. The TIM 264 may be the same or substantially equivalent material to the TIM 256 described above.

Figure 4:
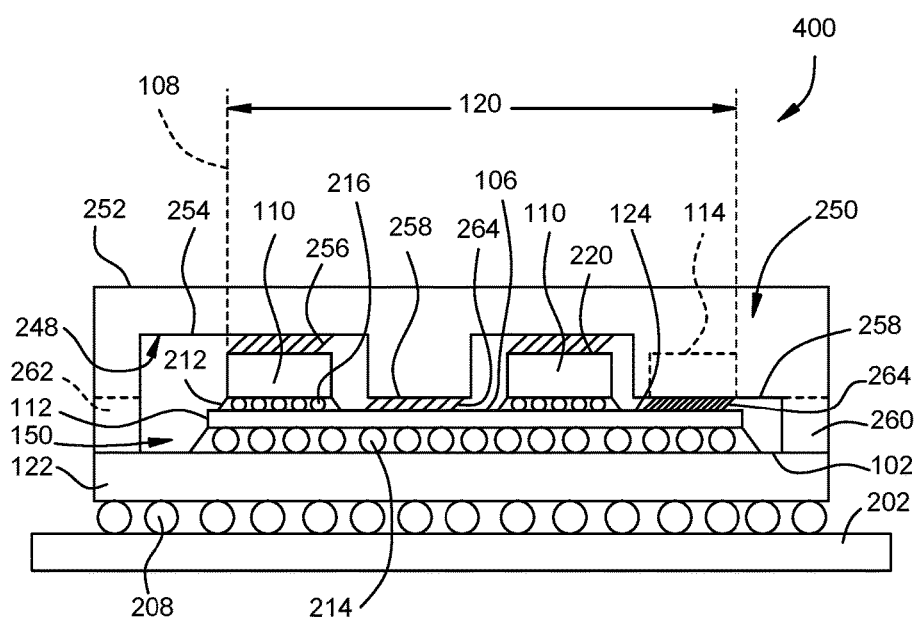
FIG. 4 is a schematic sectional view of another chip package assembly having a conformal lid.

FIG. 4 is a schematic sectional view of another chip package assembly 400 having a conformal lid 450. The chip package assembly 400 is substantially identical to the chip package assembly 100 described above except wherein the middle IC die 110 is removed so that the first surface 106 of the interposer 112 includes at least one free region 124 that separates at least two IC dies, such as the IC dies 110. The first surface 106 of the interposer 112 may also include multiple free regions 124. For example portions of the lid 450 may be configured similar to the lid 250 as shown in FIG. 2, wherein the first surface 106 of the interposer 112 includes free regions 124 separated by at least one IC die.

In the configuration illustrated in FIG. 4, the lid 450 includes multiple second regions 258 that at least partially align with the free region 124 of the die receiving area 120. The lid 450 may including one first region 254 disposed between at least two second regions 258. The first and second regions 254, 258 are utilized to stiffen the lid and enhance heat transfer using TIMs 256, 264 as described above.

Figure 5:
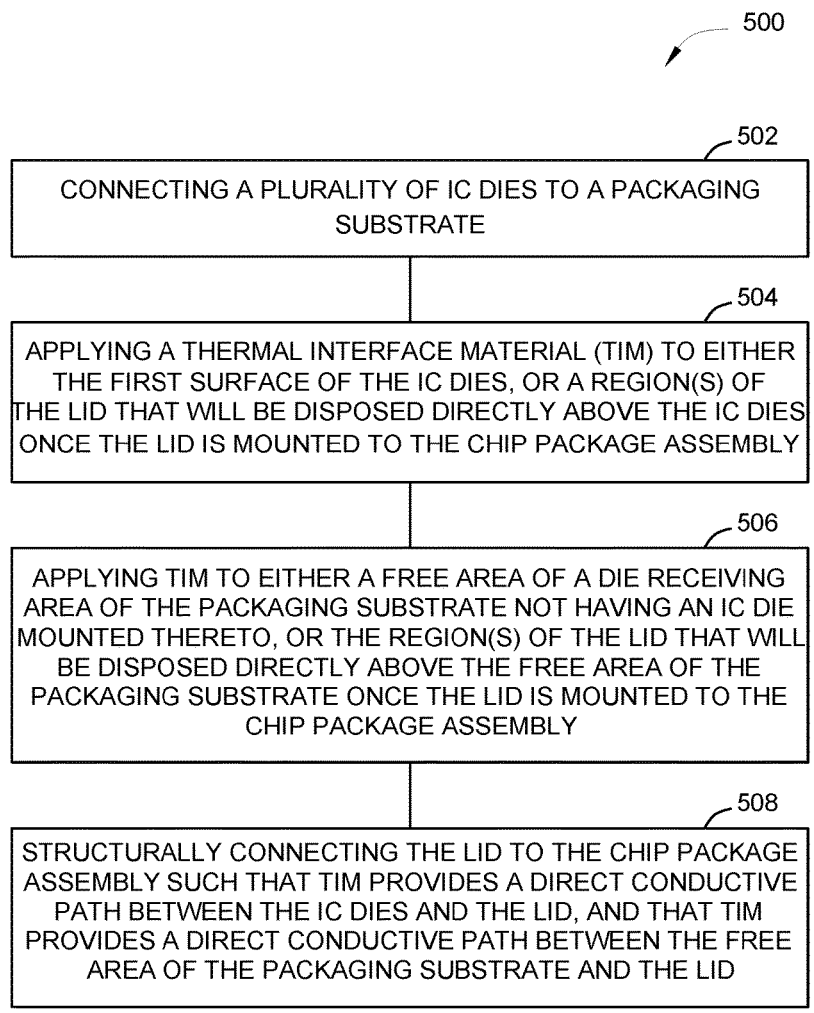
FIG. 5 is an operation diagram of one example of a method for forming a chip package assembly having a conformal lid.

FIG. 5 is an operation diagram of one example of a method 500 for forming a chip package assembly 100 having conformal lid. The method 500 begins at operation 502 by connecting a plurality of IC dies to a packaging substrate 150, such as the package substrate 122 or the interposer 112 described above. In embodiments wherein an interposer 112 is utilized, the interposer 112 is coupled to the package substrate 122 using conventional or other suitable techniques.

At operation 504, a thermal interface material (TIM) 256 is applied to either the first surface of the IC dies 110, 114 or the region(s) 254 of the lid that will be disposed directly above the IC dies 110, 114 once the lid is mounted to the chip package assembly 100.

At operation 506, TIM 264 is applied to either the free region 124 of die receiving area 120 of the packaging substrate not having an IC die mounted thereto or the region(s) of the lid that will be disposed directly above the free region 124 of the packaging substrate once the lid is mounted to the chip package assembly.

At operation 508, a lid 250, such as the lid 250, 450 among others, is structurally connected to the chip package assembly such that the TIM 256 provides a direct conductive path between the IC dies 110, 114 and the lid. Once the lid is mounted, the TIM 264 also provides a direct conductive path between the free region 124 of the packaging substrate and the lid. In one example, the lid is structurally connected to the package substrate using an epoxy or other suitable adhesive.

Thus, a chip package assembly and method for fabricating the same have been provided which utilize a conformal lid to improve the resistance of a package substrate to out of plane deformation. The conformal lid substantially eliminates the need for dummy dies to fill surface area within a die receiving area of the surface of the packaging substrate to which the dies are mounted. Compared with chip package assemblies utilizing dummy dies, the chip package assemblies described herein utilizing a conformal lid are less expense to produce due to reduced raw material requirements and vastly simplified manufacturing techniques. Accordingly, the implementations described above advantageously provide enhanced warpage control while maintaining lower package profile and lower unit costs, among other benefits.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
   a first integrated circuit (IC) die;
   a second IC die, each of the first and second IC die has a first surface and a second surface that faces way from the first surface;
   a packaging substrate having a first surface and a second surface, the first surface of the packaging substrate facing the second surface of the IC dies and having a die receiving area surrounded by a ring shaped boundary area, the die receiving area defined by the laterally outermost extents of the IC dies mounted to the first surface of the packaging substrate extended to intersect at right angles; and
   a lid having a first surface and a second surface facing away from the first surface, the second surface of the lid being rigid, stepped, and structurally coupled to the package substrate, the second surface of the lid having a first region and a second region, the first region disposed over the first IC die, the second region of the lid extending below the first surfaces of the first and second IC dies, the second region of the lid spaced above the first surface of the packaging substrate, wherein at least a portion of the second region of the lid is overlapped with the die receiving area and the boundary area, and not disposed between the first and second IC dies.

2. The chip package assembly of claim 1, wherein the second surface of the lid further comprises:
   a mounting region circumscribing the first and second regions, the mounting region disposed farther from the first surface of the lid than the second region, the mounting region bonded to the first surface of the packaging substrate.

3. The chip package assembly of claim 1 further comprising:
   a ring shaped stiffener having a first side bonded to the second surface of the packaging substrate and a second side coupled the second surface of the lid.

4. The chip package assembly of claim 1 further comprising:
   a thermal interface material conductively coupling the first region of the lid to the first surface of the first IC die.

5. The chip package assembly of claim 1 further comprising:
   a thermal interface material conductively coupling the second region of the lid to the first surface of the packaging substrate within the die receiving area.

6. The chip package assembly of claim 1, wherein the packaging substrate is a package substrate adapted for coupling to a printed circuit board (PCB).

7. The chip package assembly of claim 1, wherein the packaging substrate is an interposer, the interposer mounted to a package substrate.

8. A chip package assembly comprising:
   a first integrated circuit (IC) die;
   a second IC die, each of the first and second IC dies having a first surface and a second surface that faces way from the first surface;
   a package substrate;
   an interposer having a first surface and a second surface, the second surface of the interposer coupled to the package substrate, the first surface of the interposer having the first IC die and second IC die mounted thereto, the first surface of the interposer having a die receiving area surrounded by a ring shaped border, the die receiving area defined by the laterally outermost extents of the IC dies mounted to the first surface of the interposer extended to intersect at right angles; and
   a lid having a first surface and a second surface facing away from the first surface, the second surface of the lid being rigid, stepped, and structurally coupled to the package substrate, the second surface of the lid having a first region, a second region and a mounting region, the first region disposed over the first IC die, the second region of the lid extending below the first surfaces of the first and second IC dies, the second region of the lid spaced above the first surface of the interposer, at least a portion of the second region of the lid overlapped with the die receiving area, the mounting region circumscribing the first and second regions and the interposer, the mounting region structurally connected to the first surface of the package substrate.

9. The chip package assembly of claim 8 further comprising:
   a ring shaped stiffener structurally connecting the mounting region of the lid to the package substrate.

10. The chip package assembly of claim 8 further comprising:
    a thermal interface material conductively coupling the first region of the lid to the first surface of the first IC die.

11. The chip package assembly of claim 8 further comprising:
    a thermal interface material conductively coupling the second region of the lid to the first surface of the interposer within the die receiving area.

* * * * *